United States Patent
Vasani et al.

(10) Patent No.: US 8,106,708 B2
(45) Date of Patent: Jan. 31, 2012

(54) HIGH SPEED LOW POWER MULTIPLE STANDARD AND SUPPLY OUTPUT DRIVER

(75) Inventors: Anand Jitendra Vasani, Irvine, CA (US); Jun Cao, Irvine, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 50 days.

(21) Appl. No.: 12/826,645

(22) Filed: Jun. 29, 2010

(65) Prior Publication Data
US 2011/0316634 A1 Dec. 29, 2011

(51) Int. Cl.
*H03F 1/14* (2006.01)
(52) U.S. Cl. .......................... 330/51; 330/261
(58) Field of Classification Search ............. 330/51, 330/252, 261, 285, 296
See application file for complete search history.

(56) References Cited

U.S. PATENT DOCUMENTS

| | | | | |
|---|---|---|---|---|
| 6,614,310 B2 * | 9/2003 | Quarfoot et al. | | 330/297 |
| 7,482,869 B2 * | 1/2009 | Wilson | | 330/199 |
| 7,504,881 B2 * | 3/2009 | Grundlingh | | 330/136 |
| 2003/0080816 A1 * | 5/2003 | Quarfoot et al. | | 330/297 |

* cited by examiner

*Primary Examiner* — Henry Choe
(74) *Attorney, Agent, or Firm* — Garlick Harrison & Markison; Bruce E. Garlick

(57) ABSTRACT

A multi-mode driver and method therefore includes a plurality of amplifiers, an adjustable load block, and adjustable current supply circuitry that selectively adjusts current magnitudes supplied to at least one of the plurality of amplifiers. The multi-mode driver can operate in a KR mode with a higher voltage supply, an SR4 mode with the higher voltage supply, and an SFI mode with a lower voltage supply. To support these modes, the multi-mode driver selectively operates a plurality of amplifiers, adjusts current magnitudes supplied to the amplifiers, and selectively adjusts an adjustable load. Thus, the multi-mode driver is operable to selectively and efficiently produce high swing and low swing output signals and to efficiently operate with any one of a plurality of supplies. The driver includes selectable loads and parallel-coupled amplifier devices that are selected based on mode.

30 Claims, 14 Drawing Sheets multi-mode driver 10

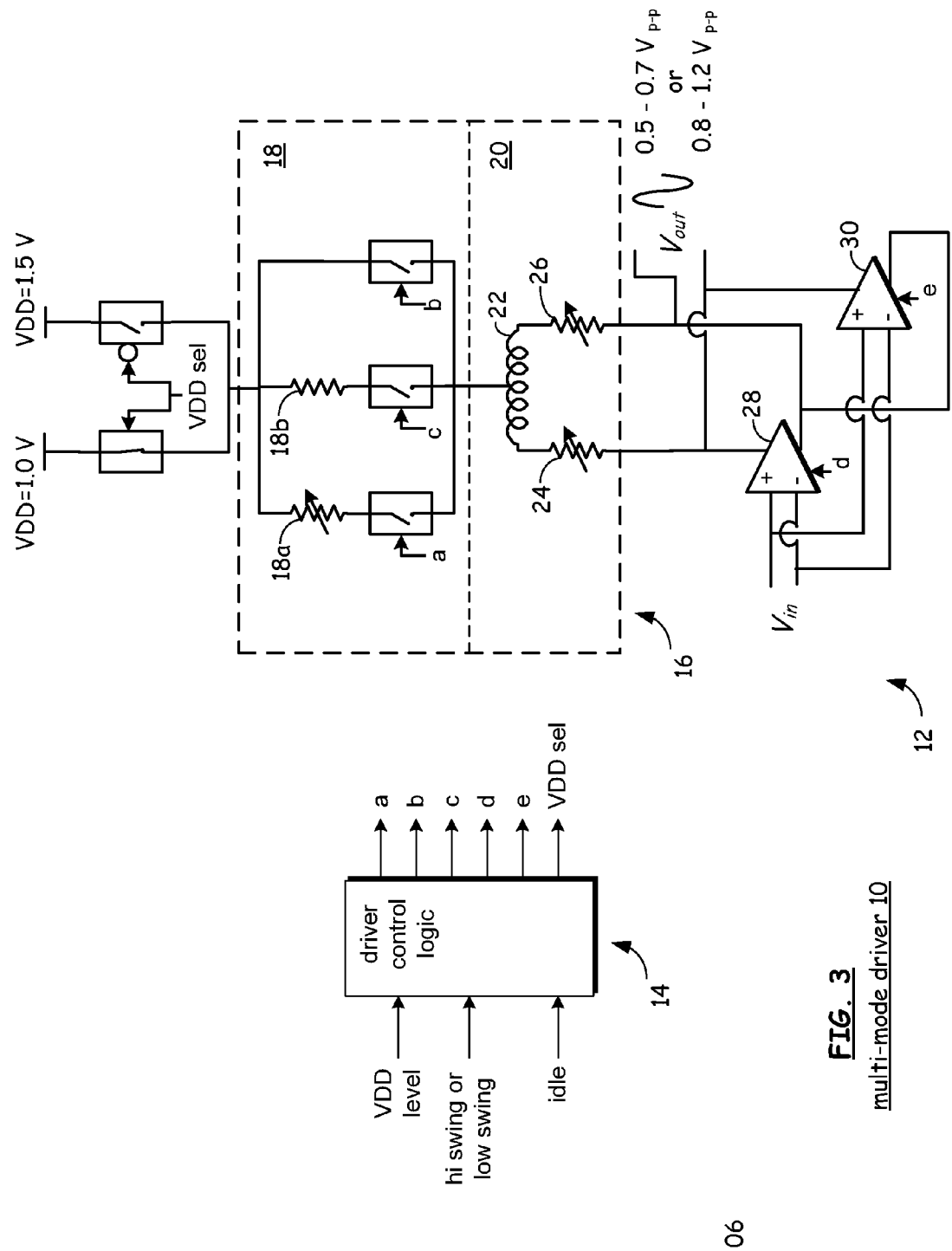

multi-mode driver 10 multi-mode driver 60 bias selection 80 multi-mode driver logic 90 calibrated resistive element multi-mode driver 100 multi-mode driver 100 multi-mode driver 100 multi-mode driver 100

HIGH SPEED LOW POWER MULTIPLE STANDARD AND SUPPLY OUTPUT DRIVER

BACKGROUND

1. Technical Field

The present invention relates to integrated circuit amplifier circuitry and, more particularly, to integrated circuit multi-mode drivers.

2. Related Art

Integrated circuit designers often forecast demand for a particular product prior to expending the resources to design, test and develop a product. Because the process for initially producing an integrated circuit product is expensive, designers typically require an expected demand level prior to investing in a new product. In many cases, however, customers have differing environmental requirements for similar products or a particular product may be utilized to operate according to different requirements or standards. Accordingly, design requirements for supply voltages and output signal magnitudes may vary. For example, both 1.5 and 1.0 Volt supplies are common. Similarly, some applications require a peak-to-peak signal magnitude of less than 1.0 Volts while other applications require an output magnitude that exceeds 1.0 Volts. Integrated circuits manufacturers thus often design circuits for multiple applications to avoid having to develop two similar integrated circuits for the different applications.

One common approach is to design a circuit with circuit elements that can withstand the most strenuous applications. A designer of a particular circuit might, for example, choose to use thick oxide devices available in the technology that can withstand the largest voltage magnitudes that may be experienced in the various applications. One problem with this approach, however, is that power consumption is greater for the lower voltage or lower power applications in relation to a device that was designed to operate under lower voltage/power conditions. Stated differently, a thinner oxide device designed for the lower power applications consumes less power and is therefore more efficient than the thicker oxide device in the lower voltage/power applications.

Another common approach is to design multiple circuits into a single device and to modify the system postproduction based on customer requirements. FIGS. 1A-1C illustrate a prior art approach similar to this. Referring to FIG. 1A, a prior art driver system 02 includes a pair of drivers 04 that are coupled by at least one trace. In FIG. 1A, four traces are shown though a different number of traces may readily be used. Drivers 04 have parallel-coupled components. In FIG. 1B, a driver 04 comprises a 1.0 Volt Supply (VDD) coupled to a pair resistors that form a load for driver 04. Each of a pair of MOSFETs is coupled to receive current from each of the resistors of the load. The source terminals of the MOSFETs are commonly coupled to a current source (sink) that in turn is coupled to circuit common. The output nodes of driver 04 (as well as driver 06 of FIG. 1C) are the nodes that couple the drain terminals of the MOSFETs to the resistors. As may be seen here, the output signal magnitude is less than 1.0 Volts and is shown as ranging from 0.5-0.7 Volts peak-to-peak. An input signal applied to the gate terminals of the MOSFETs is amplified and produced at the output terminals as shown. Often, the output signal magnitude is substantially similar but has greater output current capacity to operate as a "driver".

Referring now to FIG. 1C, it may be seen that the circuit topology of a driver 06 is similar to that of driver 04 of FIG. 1B. Here, however, the supply is 1.5 Volts, the current source produces (sinks) twice the current of driver 04 and the output signal magnitude ranges from 0.8-1.2 Volts peak-to-peak. Additionally, while not shown here, the gate oxide thickness for the MOSFETs of driver 06 is greater than driver 04 to withstand the higher operational voltages for a low swing output. In this case, the current is reduced by half.

In the prior art, designers typically produce two separate drivers for the different applications (e.g., high swing or low swing) or the different supply voltage levels on different cores. Alternatively, as shown in FIG. 1A, two drivers 04 may be fabricated with one or more traces coupling similar circuit elements in parallel to effectively create a driver with the performance capability of driver 06 to operate in KR mode. Thus, post-production, the traces coupling the parallel-coupled components may be cut to permanently create a low swing low supply driver. Thus, one design may be used and subsequently modified post-production according to customer requirements. Such modifications, however, are permanent.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which:

FIG. 3 is a functional block diagram of a multi-mode driver according to one embodiment of the invention that supports high swing, low swing and idle mode operations.

DETAILED DESCRIPTION OF THE DRAWINGS

Figure 1:
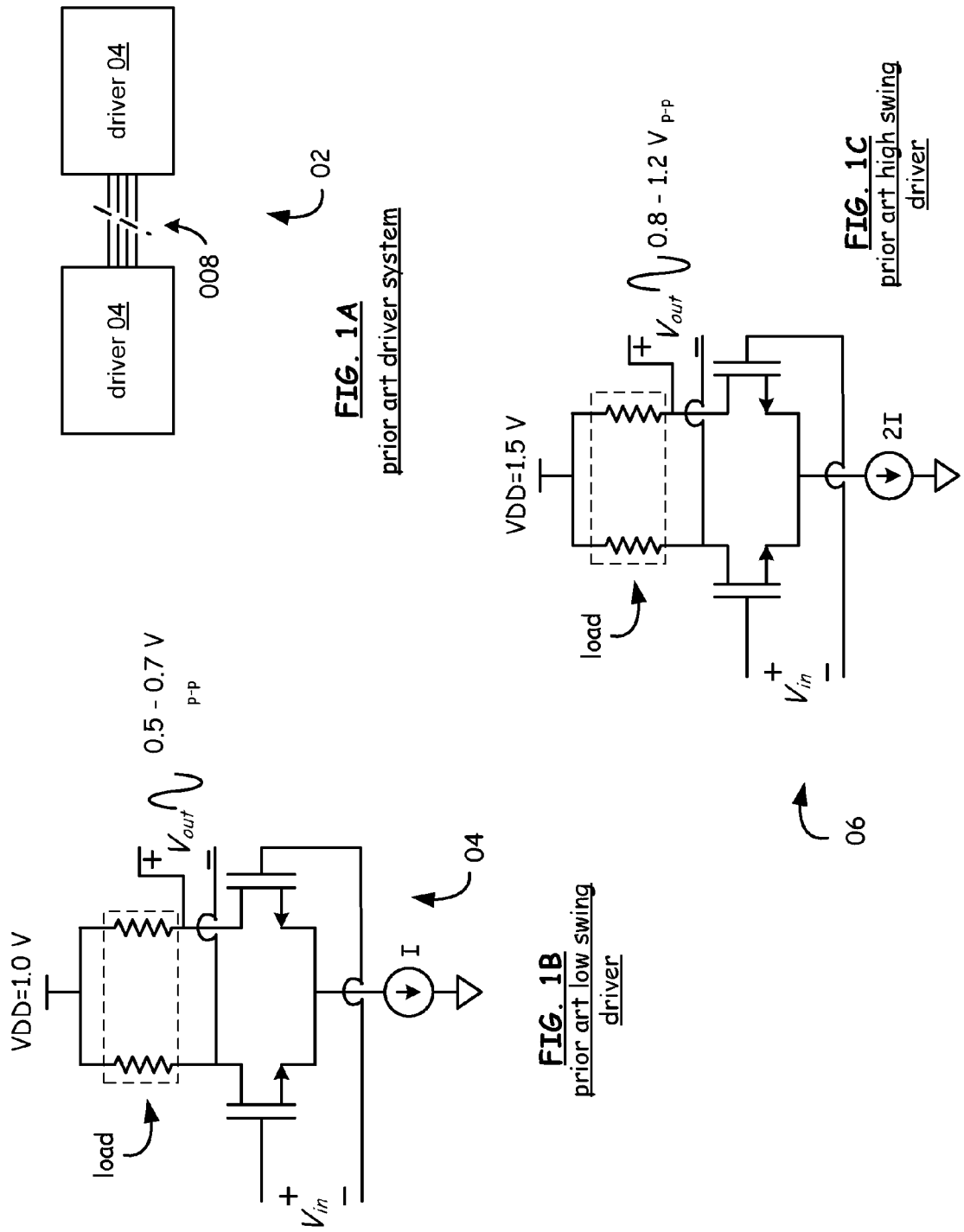
FIGS. 1A-1C are functional block diagrams that illustrate prior art drivers.

High-speed output drivers demand a significant portion of the overall transmitter power, area and tend to limit the overall performance of the entire system. Such drivers are designed for a multitude of applications including various protocol wire line communications such as those that, for example, comply with IEEE 802.3 Ethernet Standards. These various standards typically define output signal characteristics such as the signal magnitudes. Traditional output drivers, accordingly, are typically designed to work with a single power supply, and are dedicated for a single standard signal or mode. In order to satisfy KR mode operations, designers utilize a higher voltage supply (e.g., 1.5 Volts) to produce a high swing output (0.8-1.2 volts peak-to-peak). For SR4 mode operations, a higher voltage supply and a low swing output (0.5-0.7 Volts peak-to-peak) is utilized in at least one embodiment of the invention to support programmability of system operation (i.e., multi-mode operations). SFI mode operations refer to a lower voltage supply (e.g., 1.0 Volts) and a low swing output.

In the prior art, drivers that conform to different standards are made on different die because of fabrication and efficiency considerations. According to the various embodiments of the invention, however, a new driver architecture allows a high-speed output driver to operate in two power domains in accordance with multiple standards and allows switching between different modes on the fly in the same core.

The new architecture maintains the high speed performance requirements for the output driver defined by the associated standards while allowing it to operate in a plurality of modes with multiple supplies without overstressing any transistor in the circuit for the higher supply that satisfy a plurality of standards. It should be understood that the various embodiments and associated concepts described herein may be adapted readily for other applications. Generally, in the described embodiments, for example, references are made to "higher supply" and "lower supply" in relation to 1.5 Volt and 1.0 Volt supplies, respectively. The various concepts described herein for driver circuits may be adapted for different applications in which there may be a plurality of supplies. A reference to a "higher" supply thus is a reference to one of a plurality of supplies having a higher voltage magnitude in a system in which several supplies may be utilized. One aspect of the embodiments of the invention is to utilize such different supplies in a power efficient manner. While it is possible to develop a driver that operates with a higher voltage supply as well as a lower voltage supply that can satisfy different standards, known approaches are inefficient with respect to power consumption and performance.

A driver can be designed, for example, that supports a standard mode often referenced as "KR", which is a high voltage swing standard with an output peak-to-peak signal magnitude ranging from 0.8-1.2 Volts, as well as "SR4" or "SFI" which are low voltage swing standards or output modes with an output peak-to-peak signal magnitude ranging from 0.5-0.7 Volts. Such a driver would have to be fabricated with a thicker oxide layer in the prior art to support higher voltage operations because there is a greater voltage across devices when operated in the low swing mode with a higher supply voltage. Using the thicker oxide devices for all applications, however, consumes unnecessary amounts of power in relation to a device that was designed for SR4 or SFI modes with lower output voltage swings. The various embodiment of the invention, however, includes drivers that can operate efficiently while complying with low voltage swing output modes/standards such as SR4/SFI and that can also operate in accordance to high voltage swing standards such as KR.

Figure 2:
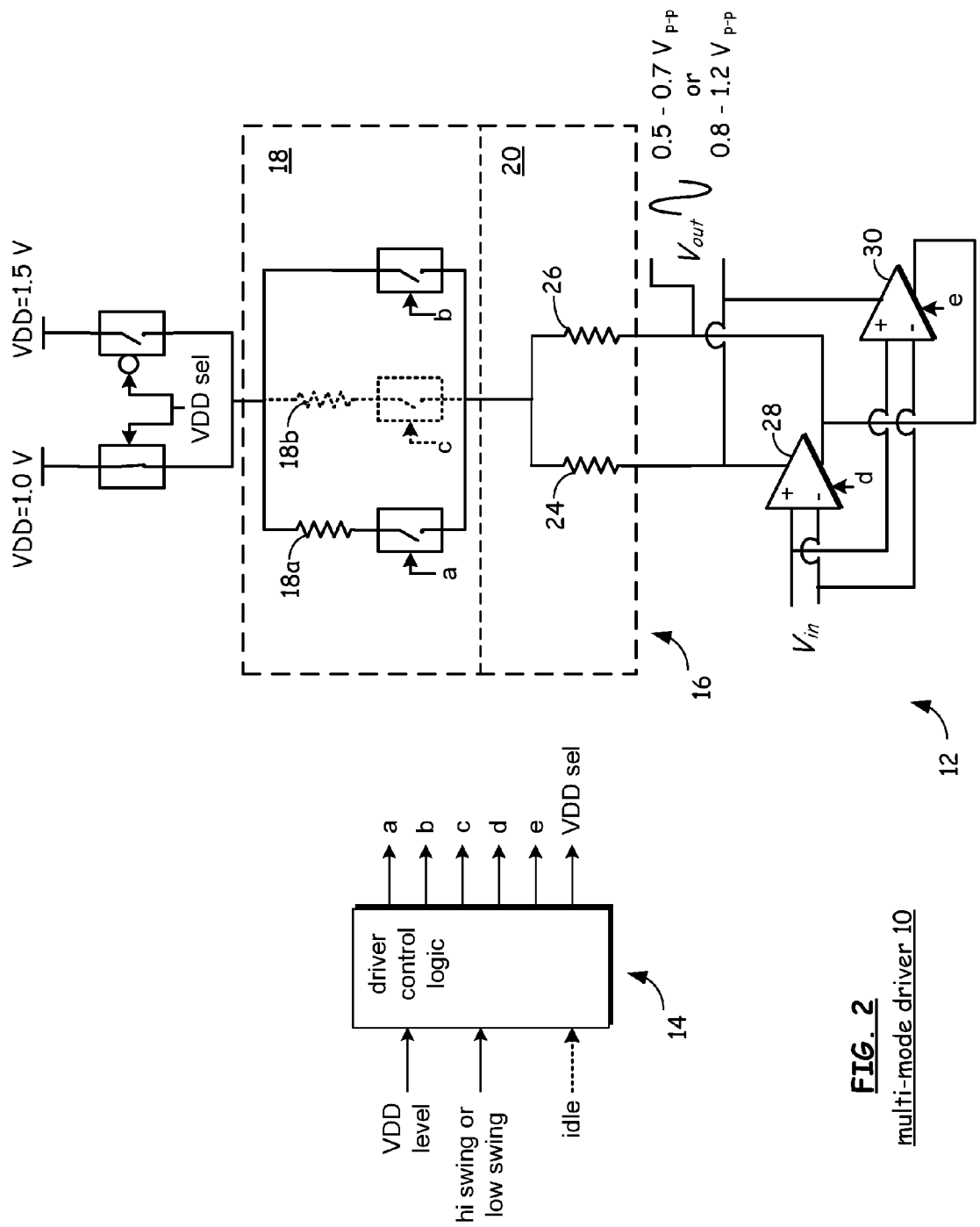
FIG. 2 is a functional block diagram of a multi-mode driver according to one embodiment of the invention that is operable to support high swing and low swing operations.

FIG. 2 is a functional block diagram of a multi-mode driver according to one embodiment of the invention that is operable to support high swing and low swing operations. The multi-mode driver 10 includes a driver circuit shown generally at 12 that is operably coupled to at least one supply of a plurality of supplies. Here, in FIG. 2, two supplies are shown wherein a VDD selection signal (VDD sel) operably selects one of the two supplies. In at least one embodiment, logic 14 generates the VDD selection signal shown in FIG. 2 based on a received indication of a VDD supply level (or selected VDD). Logic 14 may be discrete logic or other logic defined in hardware or, alternatively, logic defined within software executed by a processor. Alternatively, however, the selection of a supply may be a permanent selection based upon a received control signal, a pin connection, or a coupled trace.

Continuing to refer to FIG. 2, the driver circuit 12 of multi-mode driver 10 includes a two-stage adjustable load 16. Adjustable load 16 includes a first stage 18 that further includes a plurality of selectable signal paths to adjust a driver supply voltage seen by the driver circuitry for operation in one of a high swing mode, a low swing mode or an idle mode based upon a selected one of a plurality of supply voltage levels and upon an output mode or required output signal magnitude. Adjustable load 16 further includes a second stage 20 that includes at least one resistive element wherein the second stage defines an input coupled to an output of the first stage. In the described embodiment, two resistive elements are used to support differential operations.

In the embodiment of FIG. 2, first stage 18 includes at least two selectable signal paths that adjust the effective supply voltage for driver circuit 12 and load circuit 20. One selectable signal path introduces an additional resistive element 18a whenever multi-mode driver 10 is operating in a low swing mode and a higher supply voltage is being used as a supply. A selectable second signal path merely couples the supply to the second stage 20 of the adjustable. A third (and optional in this embodiment) signal path couples an additional resistive element 18b whenever multi-mode driver 10 is operating in an idle mode. Functionally, loading is adjusted by closing a switch to couple a branch or signal path of first stage 18 to second stage 20. The third signal path is shown with dashed lines to represent that the optional signal path that may be used for an idle mode of operation. Here, an optional resistive element 18b may be selectively coupled during idle mode operations. The associated switches for each of the three signal paths are selectively closed to couple the associated signal path by control signals shown here as "a", "b", and "c" that are generated by logic 14.

Second stage 20 of two-stage load 16 includes, in the embodiment of FIG. 2, first and second resistive elements 24 and 26, respectively. Resistive elements 24 and 26 are coupled supply current to first amplifier 28 and to second amplifier 30, respectively. Amplifiers 28 and 30 are coupled in parallel and both receive an input signal Vin and produce an output signal to output nodes that couple the resistive elements 24 and 26 to amplifiers 28 and 30, respectively. As may be also seen in FIG. 2, logic 14 generates control signals "d" and "e" for selectively turning amplifiers 28 and 30 on or off.

In operation, logic 14 generates control signals "a"–"e" and VDD sel selected supply voltage VDD (e.g., in the example shown, either 1.0 V or 1.5 V) and according to a selected high swing or low swing mode of operation. A high swing mode of operation is one in which the output signal magnitude ranges, for example, from 0.8-1.2 Volts while a low swing mode of operation is one in which the output signal magnitude ranges from 0.5-0.7 Volts. Thus, the load selection logic is operable to select one of the selectable paths of the adjustable load (more specifically, of first stage 18) and at least one of amplifiers 28 and 30 based upon a selected mode of operation and based upon a selected supply voltage level.

Multi-mode driver 10, in one embodiment, places the first and second amplifiers in a reduced power mode during the idle mode. The reduced power mode is one in which either low power levels are supplied to the amplifiers 28 and 30 to reduce power consumption but to support fast recovery time when multi-mode driver 10 transitions out of the idle mode or in which one amplifier is supplied with a low power level while the other is turned off. To support this fast recovery time, the multi-mode driver 10 keeps the output quiescent voltage the same as when it was in the normal mode of operation by dropping the voltage with respect to the supply by the same amount as when in normal mode. The low power mode current is programmable and the current is selected based on the original mode of operation. For example, KR has a corresponding KR idle mode and SFI has an SFI idle mode. References to reduced power mode thus generally include one amplifier being supplied with lower power and the other amplifier being turned off or both amplifiers being supplied with lower power according to the original or prior mode of operation. Because the reduced power levels are a function of the mode of the drivers (ie., KR or SFI or SR4), the reduced power levels vary. In one embodiment of the invention, these power levels are programmable. In the described embodiment, the output quiescent voltage is maintained at the previous level while operating in the normal mode of operation. As may also be seen, logic 14 is optionally coupled to receive an idle mode indication. Logic 14 determines to power down amplifiers 28 and 30 based on the received mode indication.

Multi-mode driver 10 selects the first selectable amplifier 28 during the low swing mode and leaves the second selectable amplifier in a reduced current mode (either low power or off) and selects both the first and second amplifiers 28 and 30 during the high swing mode. In one embodiment, amplifier 28 is powered for normal operation while amplifier 30 is turned off. References herein to an amplifier, such as first and second amplifiers 28 and 30, being selected should be understood to mean selected to operate and operate to amplify ingoing signals to produce a corresponding output with a gain in amplitude. References to an amplifier being placed into a reduced current mode include both placing the amplifier in the low current mode or, alternatively, turning the amplifier off.

In one embodiment, multi-mode driver 10 may transition between high swing and low swing modes of operation on a dynamic basis. In another embodiment, the selected mode is substantially permanent. When the operational mode is the low swing mode, the second amplifier is turned off especially in applications where the selection between high swing mode and low swing mode is substantially permanent. In the more dynamic environment, the second amplifier (that is not the selected amplifier) may be placed into a low current mode or it may be turned off during the low swing mode.

FIG. 3 is a functional block diagram of a multi-mode driver according to one embodiment of the invention that is operable to support high swing and low swing operations. Multi-mode driver 10 of FIG. 3 is similar to multi-mode driver 10 of FIG. 2 except that the circuitry defines logic to support the idle mode as well as high swing and low swing modes. Additionally, driver circuit 12 of multi-mode driver 10 uses calibrated resistive elements for resistive elements 18a, 24 and 26. Calibrated resistive elements comprise circuitry that is designed to provide precise resistive values. In one embodiment, for example, one main resistor is coupled to switchable (selectable) resistors in parallel, so that the resistance can be increased or decreased based on the variation of resistance by switching in or out the selectable and parallel coupled resistors. More generally, references herein to calibrated resistive elements are references to resistive elements that are adjusted to have a precise desired value (within a specified tight tolerance which is much tighter that traditional tolerances for resistors that run, for example, from ±13 percent). The calibrated resistors give lesser variation in output magnitude across variation in process.

The multi-mode driver 10 includes a driver circuit shown generally at 12 that is operably coupled to at least one supply of a plurality of supplies. Here, in FIG. 3, two supplies are shown wherein VDD selection signal VDD sel operably selects one of the two supplies. A signal generated by logic may be used to dynamically select a supply. Alternatively, however, the selection of a supply may be a permanent selection based upon a received control signal, a pin connection, or a coupled trace. In at least one embodiment, as shown here in FIGS. 2 and 3, logic 14 generates the VDD selection signal shown in FIG. 3 as "VDD sel". Logic 14 may be discrete logic or other logic defined in hardware or, alternatively, logic defined within software executed by a processor (not shown).

Continuing to refer to FIG. 3, the driver circuit 12 of multi-mode driver 10 includes a two-stage adjustable load 16. Adjustable load 16 includes a first stage 18 that further includes a plurality of signal paths for operation in one of a high swing mode, a low swing mode or an idle mode based at least in part upon which one of a plurality of supply voltage levels is selected to provide a supply voltage. Adjustable load 16 further includes a second stage 20 that includes at least one calibrated resistive element 24 or 26 wherein the second stage defines an input coupled to an output of the first stage. Here in FIG. 3, both resistive elements 24 and 26 are calibrated resistive elements. At least two resistive elements are used in this embodiment to support differential operations. In one embodiment, calibrated resistive elements comprise a plurality of selectable resistors that may be switched in and out of coupling. The specific configuration of such resistors are a function of design requirements and may readily be ascertained by one of average skill in the art. For example, the calibrated resistive elements may include a plurality of parallel coupled resistor paths (similar to portion 18 of adjustable load 16) with MOSFET switches to select a resistor for coupling by closing the switch or for decoupling by opening the switch. Such selectable resistive elements are in parallel to a primary signal path containing a resistive element. As such, more precise or "calibrated" resistor values may be obtained by adding or removing parallel coupled resistive elements to increase or decrease, respectively, the overall resistive value. Such a configuration is shown in the exemplary embodiment of FIG. 14 and the associated discussion below.

In the described embodiment of FIG. 3, first stage 18 includes three selectable signal paths to adjust the value of adjustable load 16 that are selected by closing an associated switch to couple a branch or signal path of first stage 18 to second stage 20. The associated switches for each of the three signal paths are selectively closed to couple the associated signal path by control signals shown here as "a", "b", and "c" that are generated by logic 14. The second stage 20 of two-stage load 16 includes, in the embodiment of FIG. 3, an inductor and first and second calibrated resistive elements 24 and 26. More specifically, a first end of inductor 22 is coupled to resistive element 24 while a second end of inductor 22 is coupled to resistive element 26. Opposite ends of resistive elements 24 and 26 are coupled supply current to first amplifier 28 and to second amplifier 30, respectively. Amplifiers 28 and 30 are coupled in parallel and both receive an input signal Vin and produce an output signal to output nodes that couple the resistive elements 24 and 26 to amplifiers 28 and 30, respectively. As may be also seen in FIG. 3, logic 14 generates control signals "d" and "e" for selectively turning amplifiers 28 and 30 on or off.

It should be noted that FIG. 3 generally shows the topology of multi-mode driver 10. In operation, logic 14 generates control signals "a"-"e" and VDD sel according to a desired or selected supply voltage VDD (e.g., in the example shown, either 1.0 V or 1.5 V) and according to a selected high swing or low swing mode of operation. A high swing mode of operation is one in which the output signal magnitude ranges, for example, from 0.8-1.2 Volts while a low swing mode of operation is one in which the output signal magnitude ranges from 0.5-0.7 Volts. Thus, the supply selection logic of logic 14 is operable to select one of the adjustable load 16 supply levels (more specifically, of first stage 18) and at least one of amplifiers 28 and 30 based upon a selected mode of operation and based upon a selected supply voltage level.

Multi-mode driver 10, therefore, places the first and second amplifiers in a low power mode during the idle mode. The low power mode is one in which reduce power levels are supplied to the amplifiers 28 and 30 to reduce power consumption but to support fast recovery time when multi-mode driver 10 transitions out of the idle mode. As may be seen, logic 14 is coupled to receive an idle mode indication. Logic 14 determines to power down amplifiers 28 and 30 based on the received mode indication.

Multi-mode driver 10 also selects the first selectable amplifier 28 during the low swing mode. The second selectable amplifier is left in a reduced power mode (either low power or off) and selects both the first and second amplifiers 28 and 30 during the high swing mode. In one embodiment, multi-mode driver 10 may transition between high swing and low swing modes of operation on a dynamic basis. In another embodiment, the selected mode is substantially permanent. For this embodiment, if the mode is the low swing mode, the second amplifier is turned off. In the more dynamic environment, the second amplifier may be placed into a reduced current mode or it may be turned off. Collectively, references herein to the amplifiers being placed into a reduced current mode include both the amplifier being placed in the low current mode and turning the amplifier off.

Figure 4A:
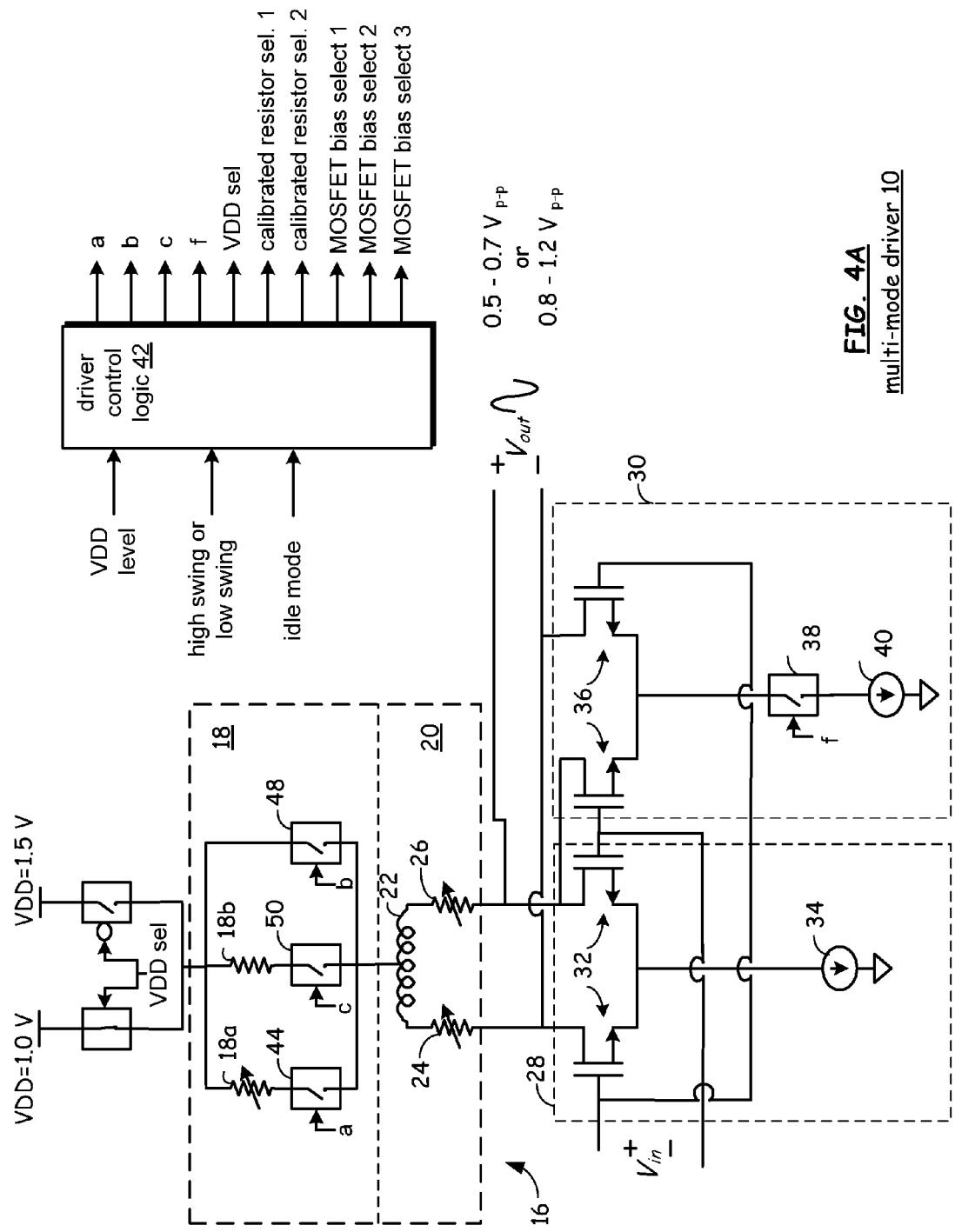
FIGS. 4A and 4B are functional block diagrams of different embodiments of a multi-mode driver.
Figure 4B:
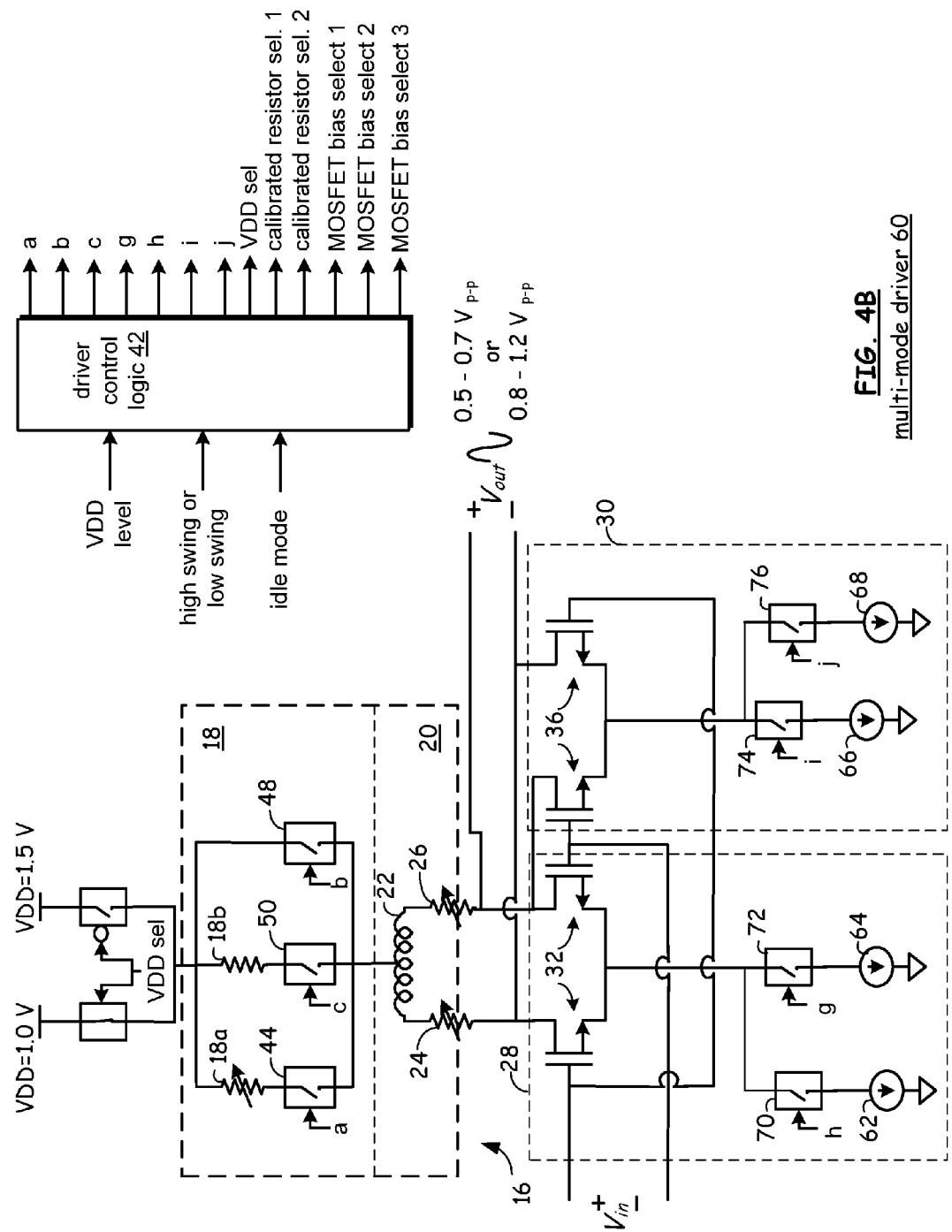

FIGS. 4A and 4B are functional block diagrams of different embodiments of a multi-mode driver. Referring to FIG. 4A, an embodiment of multi-mode driver 10 is shown which includes an embodiment of driver circuit 12 and an alternative embodiment of logic 14 shown here as logic 42. Multi-mode driver 10 of FIG. 4A also includes a two-stage adjustable load 16 that further includes first and second stages 18 and 20 as described in relation to FIG. 3. Commonly referenced elements are used for the same or similar elements in the various figures and their description will not be repeated. In this embodiment, however, two pairs of differentially configured MOSFETs with associated current sources are shown as embodiments of amplifiers 28 and 30. Referring to amplifier 28, a pair of MOSFETs 32 has two MOSFETs with commonly coupled source terminals. The drain terminal of each of the two MOSFETs 32 is coupled to one of the two calibrated resistive elements of the second stage 20 and to the two output nodes or terminals shown as $V_{out}$. The commonly coupled source terminals of the MOSFETs 32 of amplifier 28 are coupled to a current source (sink) 34. Current source 34 sinks current conducted through the pair of MOSFETs 32 and helps establish the gate to source voltage required to properly bias the MOSFET devices.

Amplifier 30 comprises a pair of MOSFETs 36 configured similarly to the MOSFETs 32 of amplifier 28. The gate terminals of the MOSFETs 36 of amplifier 30 are commonly coupled to the gate terminals of MOSFETs 32 of amplifier 28 as shown. The source terminals of the MOSFETs 36 of amplifier 30, however, are coupled to a selectable switch 38 that selectively couples the source terminals of MOSFETs 36 to a current source 40. Accordingly, based upon a control signal labeled as "f" generated by logic 42, current source 40 may be decoupled from MOSFETs 36 of amplifier 30 to effectively turn amplifier 30 off.

Logic 42 generates control signals a-c to select one of the three signal paths of adjustable load 16, control signal f to selectively couple supply 40 to MOSFETs 36, VDD sel to select a supply, and a plurality of calibrated resistor selection signals shown as calibrated resistor sel. 1 and calibrated resistor sel. 2. In the embodiment of FIG. 4A, logic 42 generates two calibrated resistor selection signals to select calibrated resistive values. A first calibrated resistor selection signal 1 is for calibrating the resistive value of resistive element 18a while a second calibrated resistor selection signal 2 is for calibrating the resistive values of resistive elements 24 and 26. Thus, for example, resistive values are selected to compensate for process variations. Generally, the resistive values that are selected are based upon the mode of operation (as with the selection of control signals a, b, c and f). These calibrated resistor selection signal may comprise a plurality of signal lines (though only one is shown for each) according to design implementation to support desired calibration requirements.

The voltage levels for a, b and c change according to mode of operation so that the voltage across the MOSFET terminals never exceeds one volt. Voltage limits for safe operation so that devices don't get damaged also apply to resistive control 1 and 2. Logic 42 is configured to generate a plurality of MOSFET bias select signals (shown here as MOSFET select bias 1, MOSFET bias select 2 and MOSFET bias select 3).

These MOSFET bias select signals 1-3 are used to generate activation voltage levels to turn on various MOSFETs/switches. These activation voltage levels are selected not only to turn on or turn off a device but also to avoid an over-voltage condition based upon a current mode of operation (whether multi-mode driver 10 is operating in a high swing mode or in a low swing mode and/or based upon the selected supply). Generally, a higher bias signal is used when a higher supply voltage is being used. As will be described in relation to FIG. 5 below, these MOSFET bias select signals 1-3 are used to select the activation or bias level for the various signals used to activate a device such as a switch. For example, these MOSFET bias select signals 1-3 may be used to set the activation level for the control signals "a", "b" or "c" and also for the resistor calibration control for calibrated resistors as will be described in greater detail below. While three MOSFET bias select signals are shown, it should be understood that a greater number or a lesser number of such bias signals may be used according to circuit topology and defined modes.

One aspect of the embodiment of the invention is that a substantially constant common mode voltage is maintained at the output when transitioning from one of the low swing mode or high swing mode to the idle mode. This common mode (DC) voltage is a function of the current used in the various modes such as the low power mode. Logic 42, when transitioning to the idle mode, maintains bias levels and current levels of the supplies in a manner that the common mode voltage remains substantially the same in the idle mode as it was in the prior mode (either high swing or low swing).

Referring now to the two-stage adjustable load 16, it may be seen that three selectable signal paths are shown. Logic circuitry (here, logic 42) generates control signal "a" to close switch 44 to select calibrated resistive element 18a, control signal "b" to close switch 48 to select a signal path without a resistive element, and control signal "c" to close switch 50 to select resistive element 18b. In the described embodiment, resistive element 18a is a calibrated resistive element having a precise resistive value and comprises at least one MOSFET. As will be described in greater detail in relation to the figures that follow, resistive element 18a is selected for low swing mode when the supply is at the higher supply level (e.g., 1.5 Volts) in the described embodiment of the invention. Resistive element 18a is calibrated to have a resistive value that drops a portion of the supply voltage such that a total voltage drop of the adjustable load 16 results in an output voltage swing that satisfies the output voltage swing requirements (e.g., low swing requirements) when a higher voltage magnitude supply is being used without damaging a transistor because of an over-voltage across the transistor.

Logic 42 selects or asserts control signal "b" to close switch 48 either when the higher supply is selected and the mode is the high swing mode or when the lower supply is selected and the low swing mode is selected. Logic 42 asserts control signal "c" when the mode is the idle mode.

FIG. 4B is similar to FIG. 4A with the exception of the current sources and logic 42. Here, the embodiment of logic 42 also generates a control signals "g", "h", "i" and "j" for selecting additional current sources as will be described below instead of generating control signal "f" as shown in FIG. 4A. A multi-mode driver 60 includes a plurality of selectable current sources for each amplifier 28 and 30. In FIG. 4B, current sources 62, 64, 66, and 68 are each coupled to an associated switch 70, 72, 74 and 76 respectively. According to the mode of operation and the selected supply, logic 42 generates control commands "g" and "h" to selectively couple current sources 62 and 64 to scale or adjust the current conducted by amplifier 28 and corresponding bias levels. Logic 42 generates control commands "g" and "h" to selectively couple current sources 62 and 64 to scale or adjust the current conducted by amplifier 28 and corresponding bias levels of MOSFETs 32. Logic 42 generates control commands "i" and "j" to selectively couple current sources 66 and 68 to scale or adjust the current conducted by amplifier 30 and corresponding bias levels of MOSFETs 36. It should be understood that the switches 44, 48, 50, 70, 72, 74 and 74 may comprise actual switches. In the embodiment of the invention, however, these switches are MOSFETs that receive a bias signal to bias the devices into an operational mode to conduct current between the source and drain terminals of the MOSFETs. Further, these switches may each be a part of the associated current source wherein asserting a gate voltage to these MOSFETs serves to operably turn the current source on (or off).

In one embodiment of the invention, with respect to amplifier 30, logic 42 does not assert "i" or "j" during low swing modes of operation to turn amplifier 30 off. Alternatively, in a low swing mode, logic 42 asserts only one of "i" and "j" to place the amplifier in a low current state. In a high swing mode of operation, logic 42 asserts "i" and "j" to couple both current sources 66 and 68. With respect to amplifier 28, logic 42 asserts both "g" and "h" during the low swing and high swing modes of operation. In the idle mode of operation, in one embodiment, logic 42 asserts either "g" or "h" and either "i" or "j" according to the prior mode. For example, if operating in an SR4 mode prior to transitioning to an idle mode, the lower current source of 62 and 64 would be turned on as well since the idle mode current requirement is higher than for SFI mode. Accordingly, more than one current source may be required for an idle mode. As another example, for idle mode when the prior mode is the KR mode, the lower current sources for amplifiers 28 and 30 are the selected current sources. As such, during the idle mode, amplifiers 28 and 30 are not powered off but, rather, are in a reduced power mode of operation. This allows the amplifiers to reach steady state more quickly once the mode of operation transitions from idle to one of the low swing or high swing mode.

Figure 5:
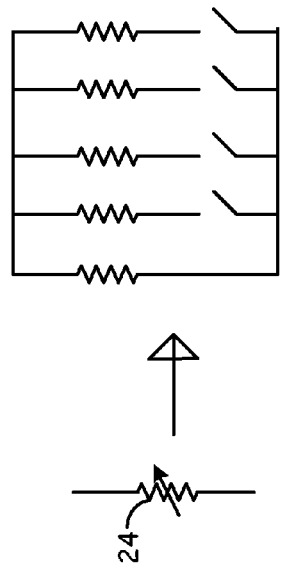
FIG. 5 is a functional block diagram of a switching system for selecting one of a plurality of MOSFET bias levels according to a mode of operation.

FIG. 5 is a functional block diagram of a switching system for selecting one of a plurality of MOSFET bias levels according to a mode of operation and/or a selected supply level. A logic device or circuit generates a bias voltage selection control signal that prompts the switch of FIG. 5 to select one of two bias or activation voltage levels. In one embodiment of the invention the bias voltage selection control signal may merely be control signal that specifies the mode of operation. For example, a control signal that asserts the high swing mode of operation may be used to drive the switching of the switch of FIG. 5 to select the corresponding bias (higher) voltage level. Generally, an over-voltage is to be avoided across a transistor. To support a configurable system, therefore, the embodiments of the invention include logic similar to that of FIG. 5 to adjust a gate voltage of a MOSFET according to whether the reference point is a higher or lower relative value to support low swing and high swing operations without creating an over-voltage situation across the transistor. In one embodiment, activation voltage level values are selected to maintain a voltage across the transistor that is less than or equal to 1.0 volts. It should be noted that each MOSFET switch shown in the various figures such as FIGS. 4A and 4B (as well as other figures) may have an associated switching circuit similar to that shown in FIG. 5 for avoiding over-voltage conditions across the MOSFET according to a current mode of operation. Thus, part of the overall operation includes selecting signal paths for coupling to create the desired mode based topology as well as selecting activation voltage levels using circuitry exemplified in FIG. 5 to select an activation voltage that avoids an over-voltage condition for an associated MOSFET.

Figure 6:
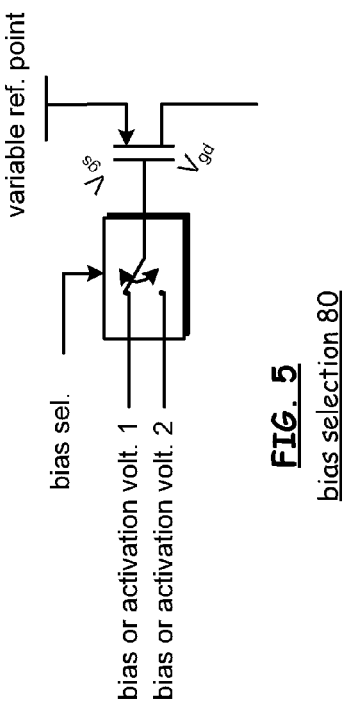
FIG. 6 is a functional block diagram of logic circuitry for selecting load values of an adjustable load, current values of selectable current sources, and amplifier bias logic according to one embodiment of the invention.

FIG. 6 is a functional block diagram of logic circuitry for selecting load values of an adjustable load, current values of selectable current sources, and amplifier bias logic according to one embodiment of the invention. A load adjustment logic 92 is operably coupled to receive an indication of a VDD control command, or, alternatively, an indication of a selected VDD supply level that is to be selected. Logic 92 also receives an indication of a high swing mode or a low swing mode of operation and an indication when the idle mode has been selected. A current selection logic 94 is operably coupled to receive an indication of a high swing mode or a low swing mode of operation and an indication when the idle mode has been selected. Finally, an amplifier bias logic 96 is operably coupled to receive an indication of the selected VDD supply level.

In operation, logic 92 selects one of the signal paths of the adjustable load (e.g., load 16) based upon the selected supply level (higher supply level or lower supply level), the swing mode (high or low) and/or whether the idle mode has been selected. Logic 92 selects the signal path by asserting either "a", "b" or "c". Logic 94 selects one or more of current sources 62, 64, 66 or 68 by asserting one or more of "g", "h", "i", or "j" in an embodiment where the drive is similar in topology as multi-mode driver 60 of FIG. 4B. Generally, logic 94 comprises logic of selecting selectable current sources. Logic 96 generates MOSFET bias sel. 1 signal-MOSFET bias sel. 3 signal to select MOSFET bias or activation voltage levels. In an embodiment where logic 96 selects MOSFET bias levels solely based on the supply voltage level, logic 96 only receives an indication of the selected supply or supply level. In an alternative embodiment, logic 96 also receives an indication of the mode (high swing or low swing) and accordingly generates corresponding MOSFET bias levels. For example, in a high swing mode of operation, logic 96 would bias all MOSFETs with selectable bias levels to a higher bias level. In a low swing of operation, however, at least one MOSFET may be biased at a lower bias level. Each of the logics 92-96 may be formed with discrete state logic or with any other known type of logic. Moreover, the logics 92-96 may be configured differently. For example, logics 92 and 96 may readily be combined into one logic circuit that performs the described functionality for both logics 92 and 96.

Figure 7:
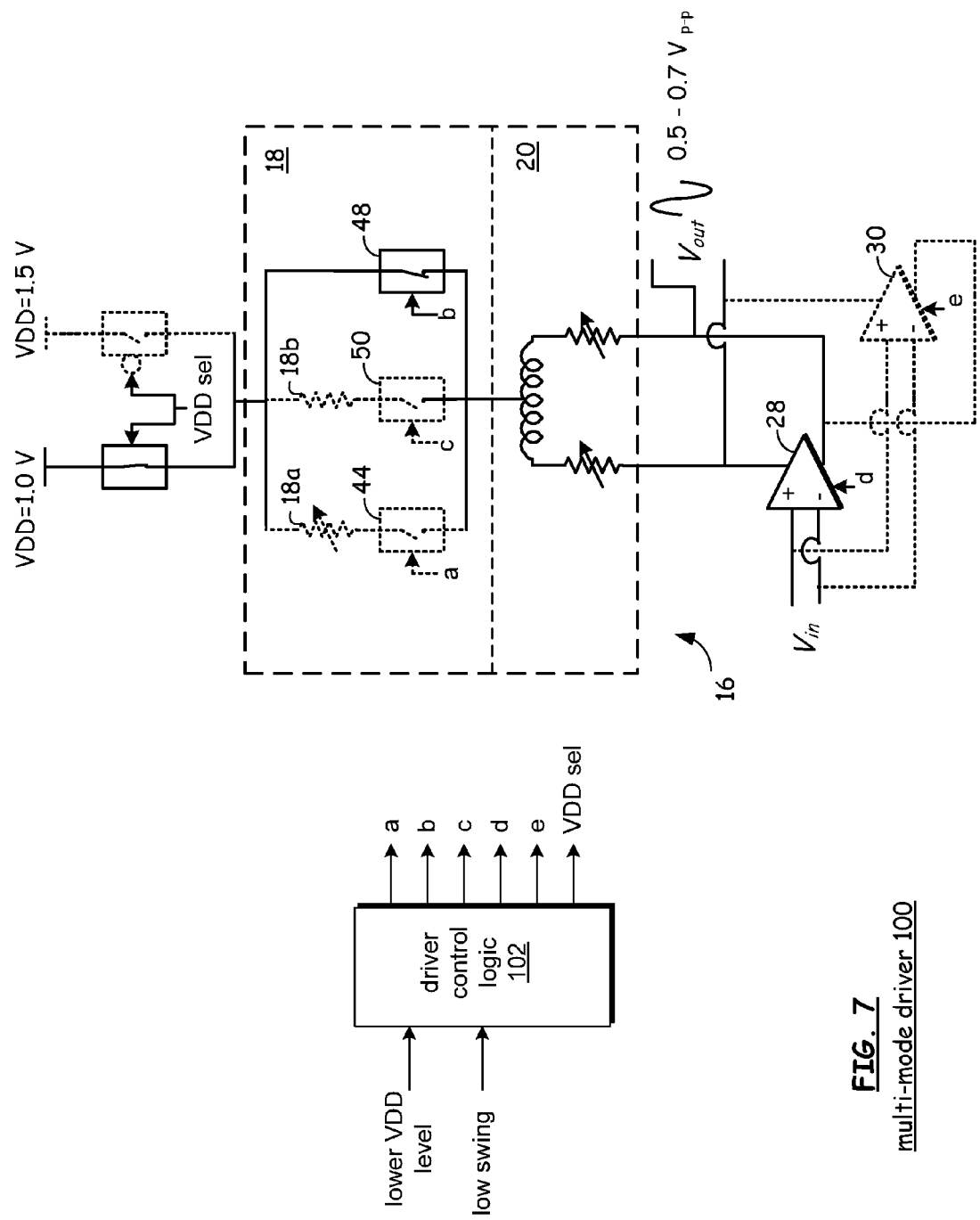
FIG. 7 is a functional diagram that illustrates operation of a multi-mode driver according to one embodiment of the invention.

FIG. 7 is a functional diagram that illustrates operation of a multi-mode driver according to one embodiment of the invention. In the example of FIG. 7, the mode of operation for multi-mode driver 100 is the low swing mode and the selected supply is the lower supply (here, 1.0 Volts). Accordingly, logic 102 receives an indication that the lower supply is to be selected (or has been selected) and the mode is the low swing mode. Logic 102 generates corresponding control signals "a"-"e" and the VDD selection control signal. Thus, since the lower supply magnitude is selected (here, 1.0 Volts), no additional loading is required in the first stage 18 of the adjustable load 16 and control signal "b" is asserted while control signals "a" and "c" are not asserted to close the associated switches. Additionally, control signal "d" is asserted to turn on amplifier 28 and control signal "e" is not asserted or, alternatively, is generated in a manner to turn off amplifier 30 (hereinafter, "not asserted" or "not selected"). It should be understood that these control signals "d" and "e" can be generated with any one of a plurality of formats or signals. For example, control signal "d" may actually comprise two signals such as signals "g" and "h" of FIG. 4B that are used to generate current for amplifier 28 and to bias amplifier 28 into a fully operational mode.

Figure 8:
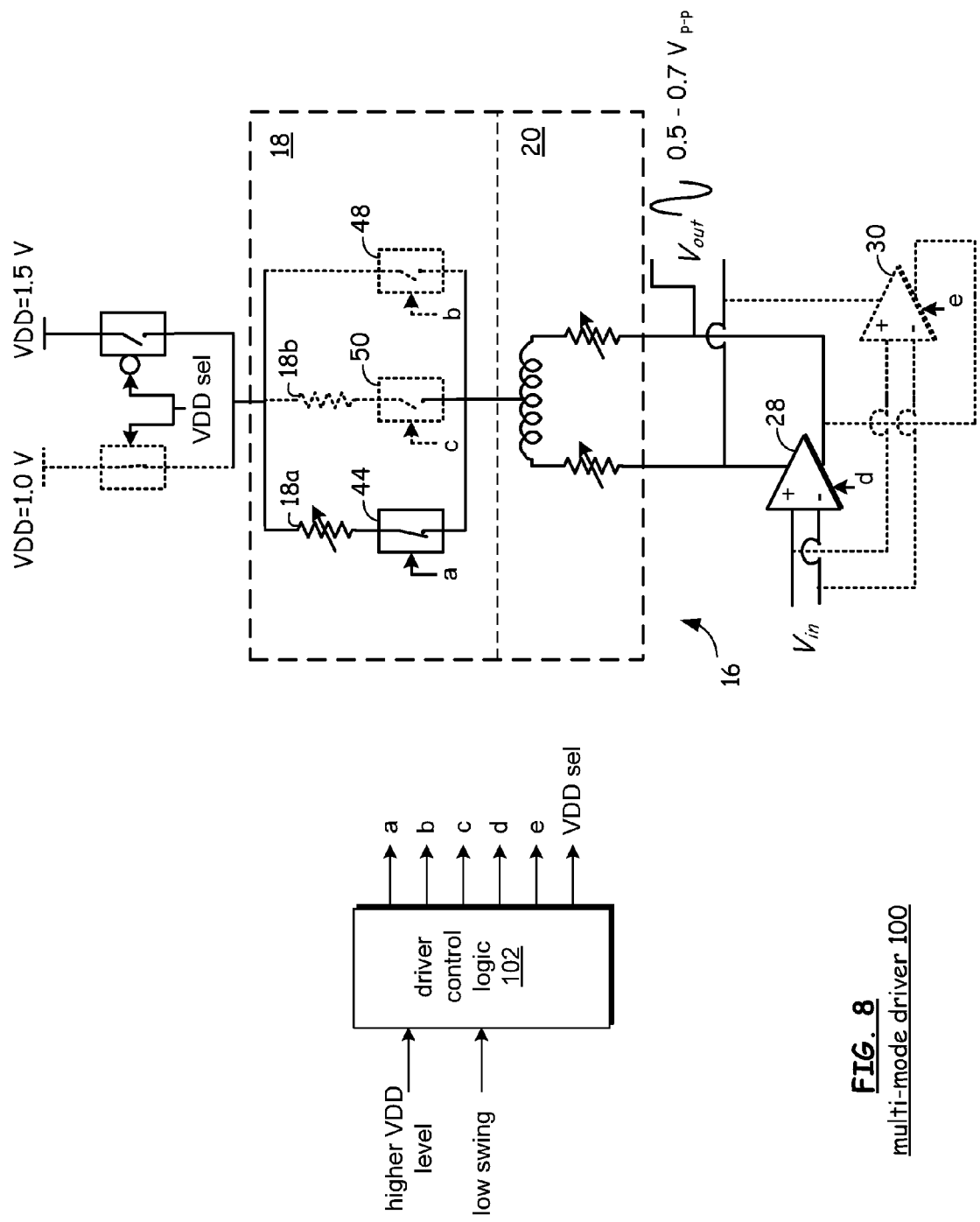
FIG. 8 is a functional diagram that illustrates operation of a multi-mode driver according to one embodiment of the invention.

FIG. 8 is a functional diagram that illustrates operation of a multi-mode driver according to one embodiment of the invention. In the example of FIG. 8, the mode of operation for multi-mode driver 100 is the low swing mode and the selected supply is the higher supply (here, 1.5 Volts). Accordingly, logic 102 receives an indication that the higher supply is to be selected (or has been selected) and the mode is the low swing mode. Accordingly, logic 102 asserts control signal "a" while control signals "b" and "c" are not asserted to close the associated switches. By asserting control signal "a", logic 102 selects calibrated resistive element 18a to provide resistive value in addition to the resistive value provided by resistive elements of the second stage of adjustable load 16. Resistive element 18a is a calibrated resistive element that serves to drop a portion of the supply voltage so that the effective supply level is lowered to prevent an over-voltage. The output is within the required signal magnitude range, which, here, is 0.5-0.7 Volts. Since the higher supply magnitude is selected (here, 1.5 Volts), additional loading is required in the first stage 18 of the adjustable load 16. Control signal "d" is asserted to turn on amplifier 28 and control signal "e" is not asserted or is generated to turn off amplifier 30.

Figure 9:
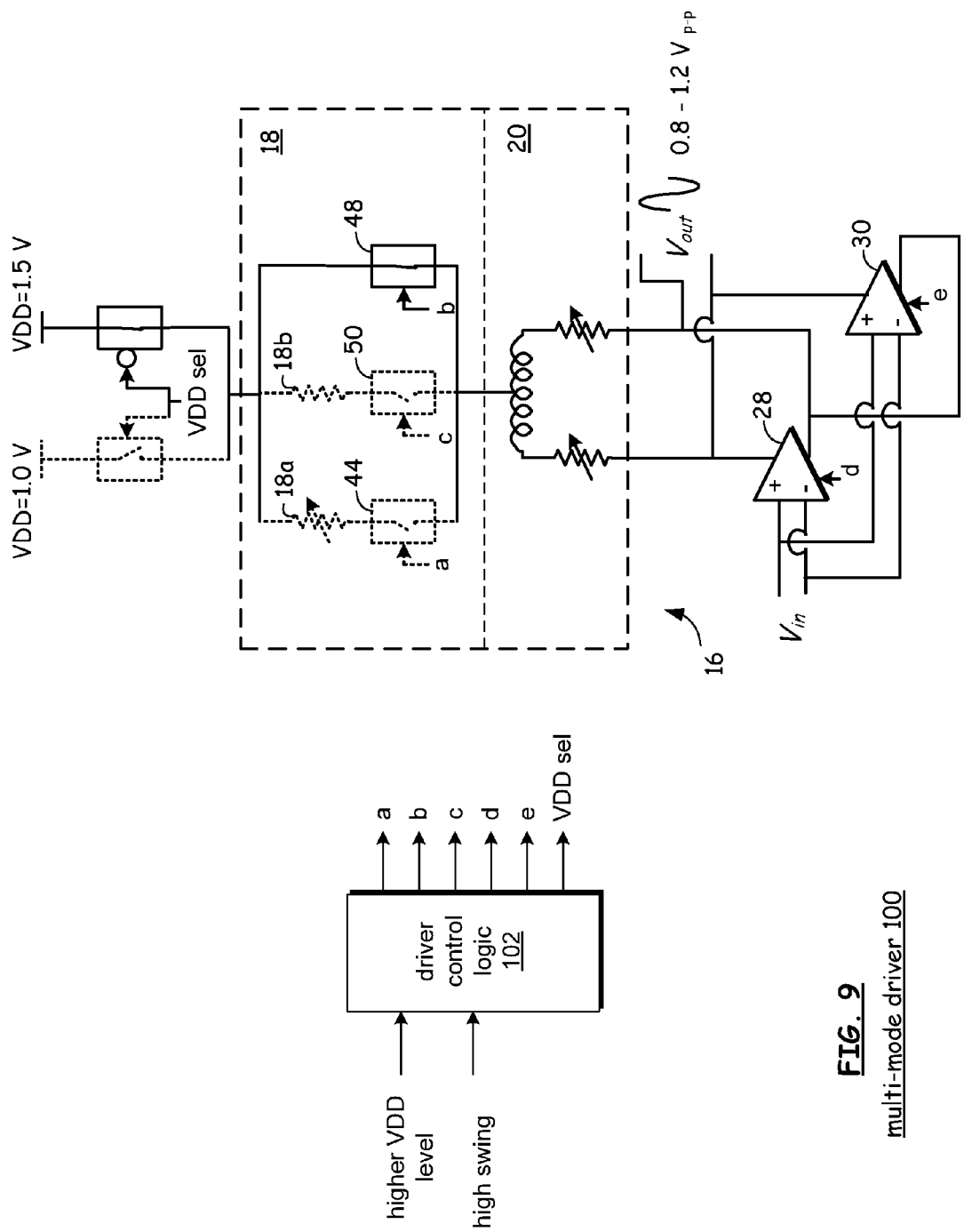
FIG. 9 is a functional diagram that illustrates operation of a multi-mode driver according to one embodiment of the invention.

FIG. 9 is a functional diagram that illustrates operation of a multi-mode driver according to one embodiment of the invention. In the example of FIG. 9, the mode of operation for multi-mode driver 100 is the high swing mode and the selected supply is the higher supply (here, 1.5 Volts). Accordingly, logic 102 receives an indication that the higher supply is to be selected (or has been selected) and the mode is the high swing mode. Accordingly, logic 102 asserts control signal "b" while control signals "a" and "c" are not asserted to close the associated switches. Logic 102 generates corresponding control signals "a"-"e" and the VDD selection control signal. Thus, since the higher supply magnitude is selected (here, 1.5 Volts), no additional loading is required in the first stage 18 of the adjustable load 16. Control signal "d" is asserted to turn on amplifier 28 and control signal "e" is asserted to turn on amplifier 30. Control signal "e" and "d" are similar and may be any one of a plurality of signal types or formats.

Figure 10:
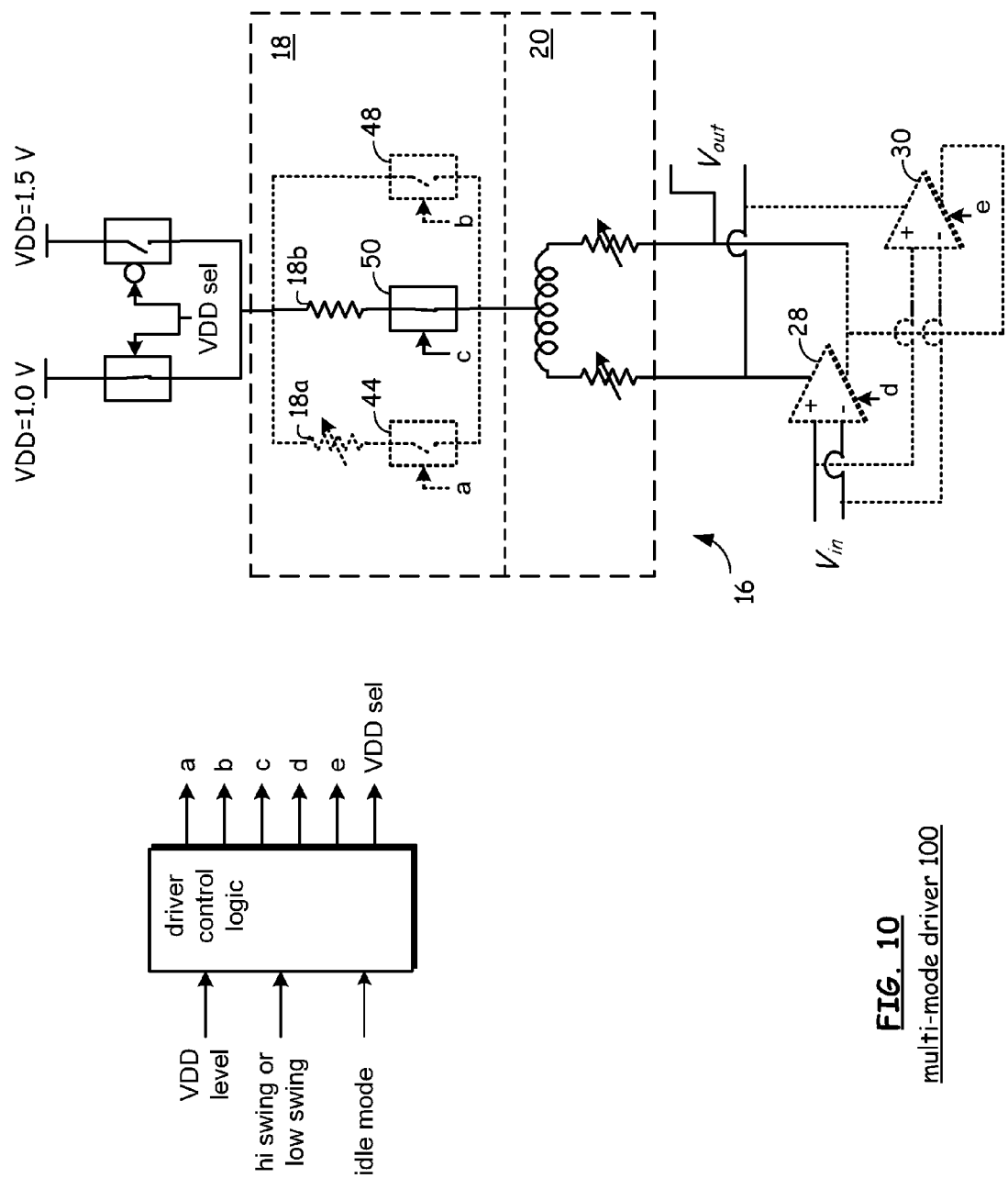
FIG. 10 is a functional diagram that illustrates operation of a multi-mode driver according to one embodiment of the invention.

FIG. 10 is a functional diagram that illustrates operation of a multi-mode driver according to one embodiment of the invention. When logic 102 receives an indication that the mode is the idle mode, logic 102 asserts control signal "c" while control signals "a" and "b" are not asserted to close the associated switches. Logic 102 generates corresponding control signals "a"-"e" and the VDD selection control signal VDD sel. In the described embodiment of the invention logic 102 does not change the selected supply when transitioning to the idle mode. Generally, each mode (e.g., high swing or low swing) has an associated idle mode state. Accordingly, the corresponding idle mode state is the one that is established. Thus, control signals are set according to a previous mode of operation and a previous supply level. Further, both amplifiers 28 and 30 are turned on, i.e., control signals "d" and "e" are asserted to turn on amplifiers 28 and 30. While not shown here, amplifiers are placed into a reduced current mode (meaning low or off) by reducing supply currents of the amplifiers. In one embodiment, the supply currents are reduced by 95 percent. The supply currents may be reduced by modifying biasing or control signals for the current sources or by switching out or turning off some of a plurality of parallel coupled current sources as shown in relation to FIG. 4B. In another embodiment, one supply current is reduced for one amplifier and another amplifier is turned off. Here, the one supply current is reduced by 95 percent.

Figure 11:
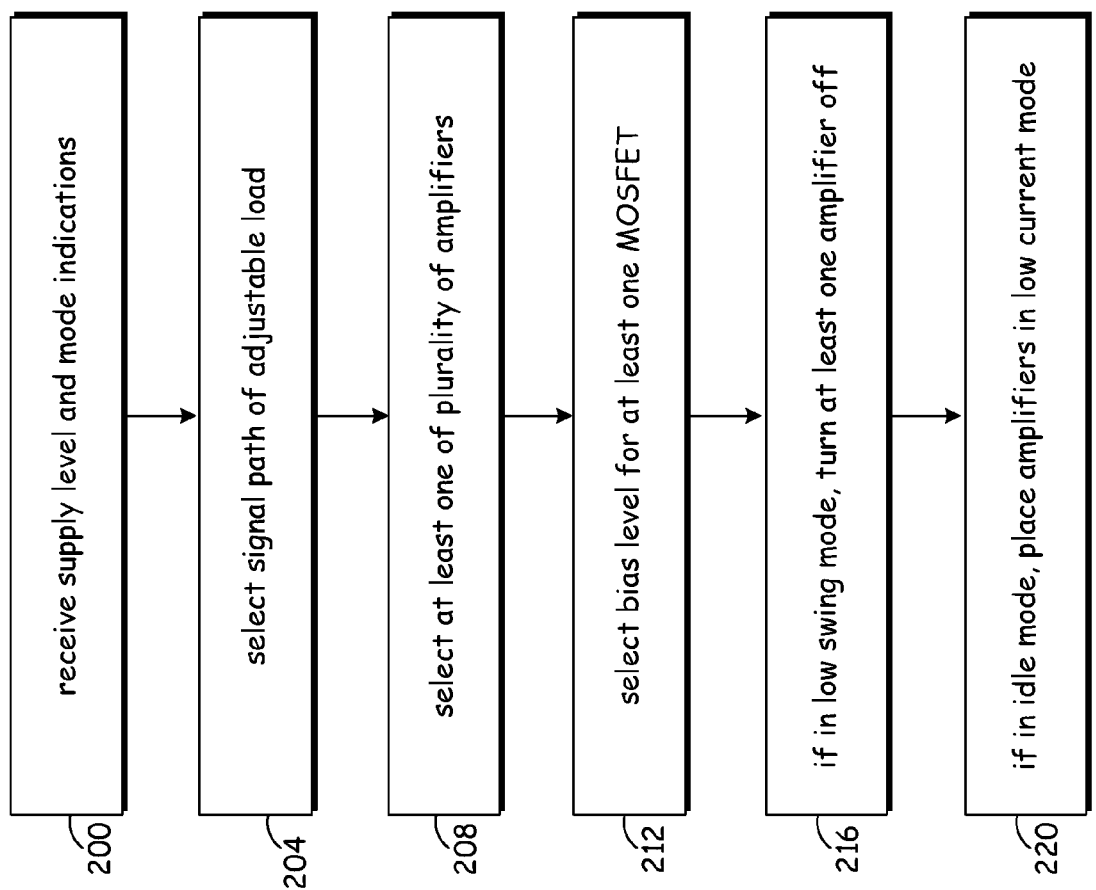
FIGS. 11, 12 and 13 are flow charts that illustrate method steps of the various embodiments of the invention.

FIG. 11 is a method for a multi-mode driver that includes a plurality of signal paths in a selectable load for driving a signal. The multi-mode driver operates in one of a plurality of modes and selects associated signal paths and circuit elements or blocks to configure the multi-mode driver to operate according to desired operational characteristics based on a selected supply and upon a selected mode of operation. Thus the method includes receiving indications of a supply level and a mode of operation (200) and selecting one of the plurality of selectable signal paths of the adjustable load (204) based upon whether the multi-mode driver is operating in one of a high swing mode, a low swing mode or an idle mode of operation and whether a supply voltage level is a first voltage level or a second voltage level.

Generally, the multi-mode driver selects a first signal path of the selectable load when the mode of operation is the low swing mode and the supply voltage is the first voltage level. The multi-mode driver selects a second selectable load signal path when the mode of operation is the high swing mode and the supply voltage is the first voltage level and when the mode of operation is the low swing mode and the supply voltage is the second voltage level. The multi-mode driver selects a third selectable path when the mode of operation is the idle mode of operation.

Here, the second supply voltage level is a lower magnitude voltage level than the first supply voltage level. In one embodiment, the first voltage magnitude is 1.5 Volts and the second voltage magnitude is 1.0 Volts.

The method further includes selecting at least one of a plurality of selectable amplifiers (208) based upon whether the multi-mode driver is operating in one of a high swing mode, a low swing mode or an idle mode of operation. The method also includes selecting a bias level for at least one MOSFET (212). In one embodiment of the invention, all MOSFETs are biased the same based on the supply voltage level. In another embodiment, all MOSFETs of the adjustable load are biased the same based upon the supply voltage level. MOSFETs of selected amplifiers are biased at a corresponding bias level (e.g., higher bias for higher supply and lower bias for lower supply) while MOSFETs of non-selected MOSFETs are either biased off. In one embodiment, for example, the method includes turning at least one amplifier off when in the low swing mode (216). The method also includes, if in the idle mode, placing the amplifiers in a low current mode (220).

Figure 12:
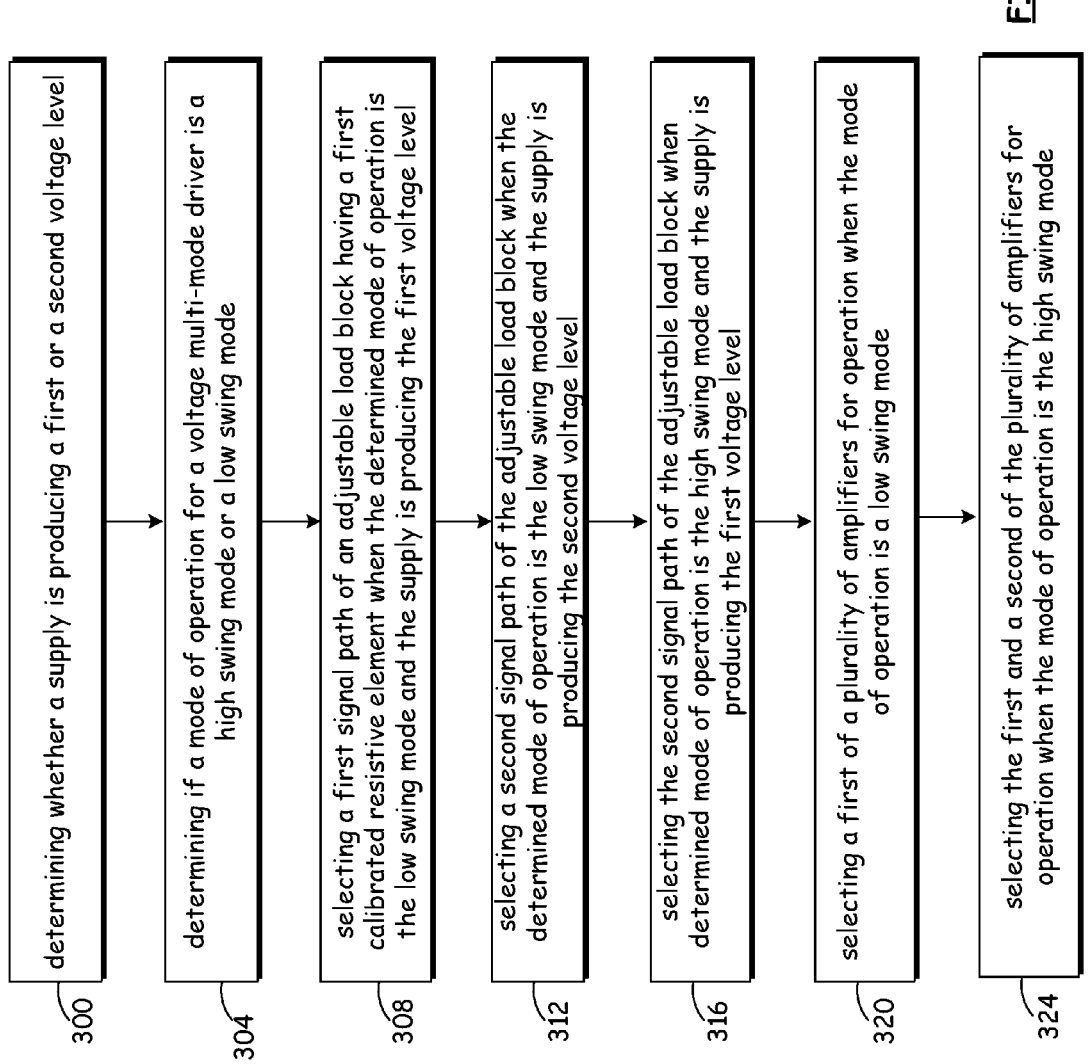
Figure 12:
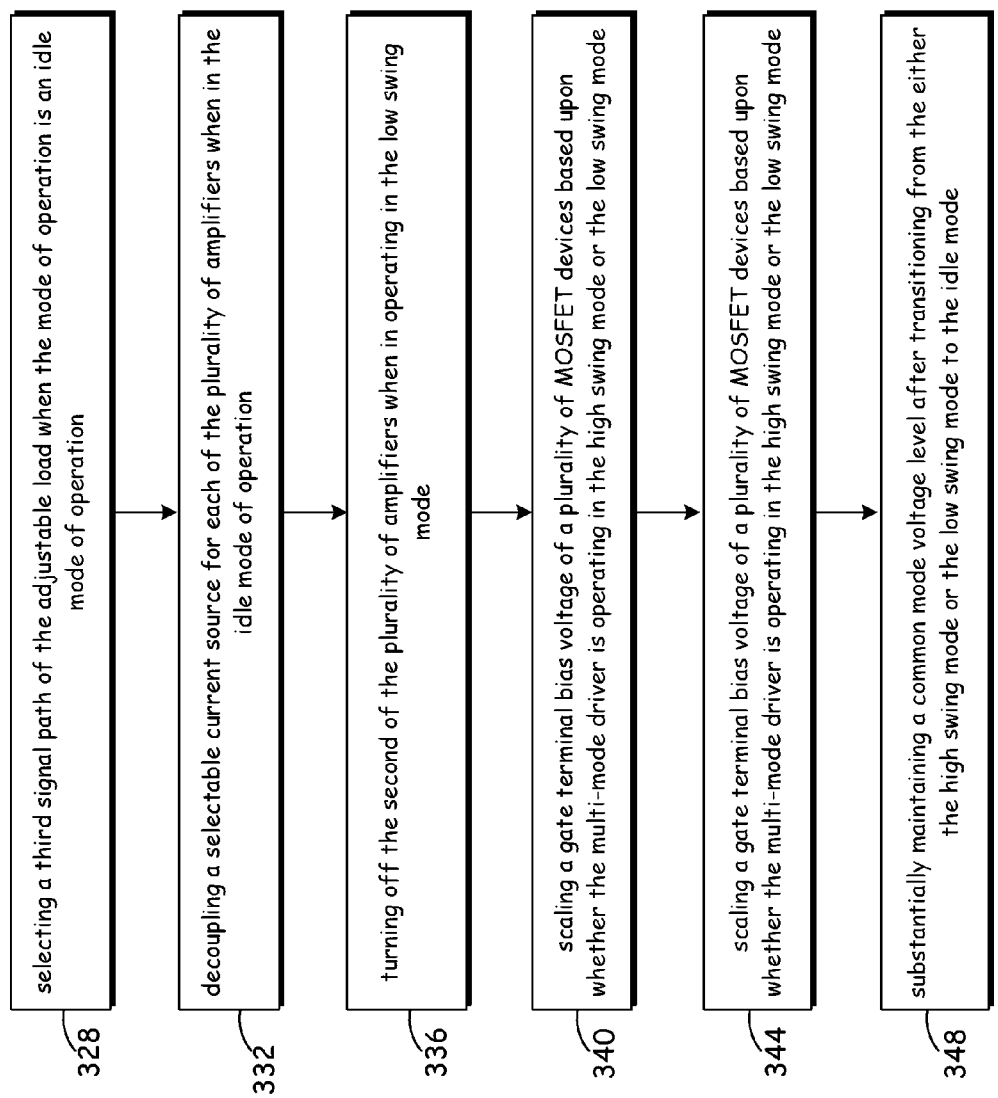

FIG. 12 is a flow chart that illustrates an alternative method for supplying an output voltage signal according to one embodiment of the invention. The method includes determining whether a supply is producing a first or a second voltage level (300) and determining if a mode of operation for a voltage multi-mode driver is a high swing mode or a low swing mode (304). Thereafter, the method includes selecting a first signal path of an adjustable load block having a first calibrated resistive element when the determined mode of operation is the low swing mode and the supply is producing the first voltage level (308). The method further includes selecting a second signal path of the adjustable load block when the determined mode of operation is the low swing mode and the supply is producing the second voltage level (312). The method further includes selecting the second signal path of the adjustable load block when determined mode of operation is the high swing mode and the supply is producing the first voltage level (316).

In addition to selecting signal paths of an adjustable mode based upon mode and supply level, the method includes selecting a first of a plurality of amplifiers for operation when the mode of operation is a low swing mode (320) and selecting the first and a second of the plurality of amplifiers for operation when the mode of operation is the high swing mode (324).

In one embodiment, the method further includes selecting a third signal path of the adjustable load when the mode of operation is an idle mode of operation (328). Further, in one embodiment comprising a plurality of current sources coupled to at least one of the selectable amplifiers, the method includes decoupling a selectable current source for each of the plurality of amplifiers when in the idle mode of operation (332). The method includes, in one embodiment of the invention, turning off the second of the plurality of amplifiers when in operating in the low swing mode (336). The method also includes scaling a gate voltage (activation voltage level) of a plurality of MOSFET devices based upon whether the supply is producing the first or the second voltage level (340). Alternatively, or optionally, the method also includes scaling a gate terminal bias or activation voltage of a plurality of MOSFET devices based upon whether the multi-mode driver is operating in the high swing mode or the low swing mode (344).

The method of the embodiment of the invention further includes substantially maintaining a common mode voltage level after transitioning from the either the high swing mode or the low swing mode to the idle mode (348).

Figure 13:
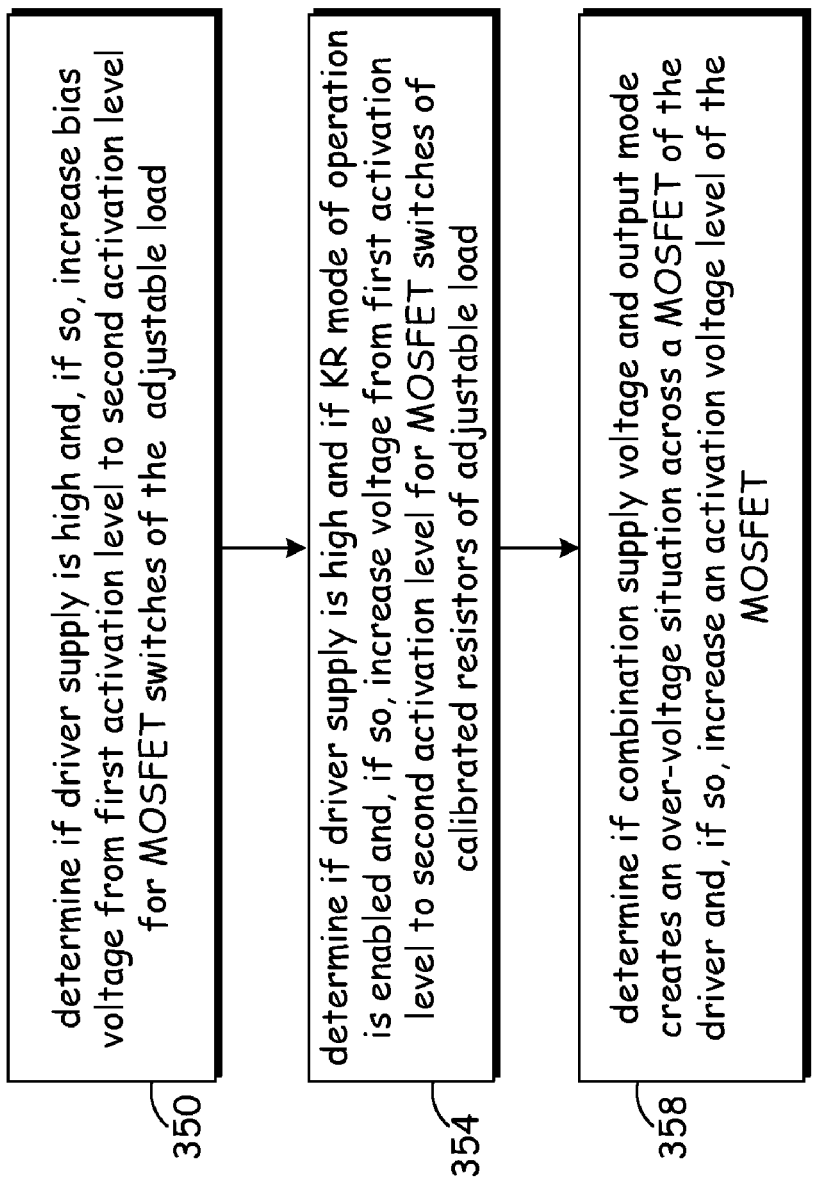

FIG. 13 is a flow chart of a method for adjusting activation voltages for a driver according to one embodiment of the invention. The method of FIG. 13 may be considered, for example, with logic shown in FIG. 5. The method generally is directed to avoiding an over-voltage situation across a MOSFET being used as a switch in the various driver embodiments during the various modes of operation described above. The first step is to determine if a driver supply is high and, if so, to increase an activation voltage from a first activation voltage level to a second activation voltage level for MOSFET switches of adjustable load (350). Different applications may use different voltages or even have different over-voltage tolerances, it should be understood that the described voltage levels are not limiting. In the described embodiments, a low driver supply may equal 1.0 V while a high driver supply may equal 1.5 V. In the described embodiments, a limit of 1.0 volts across a MOSFET is preferred based upon design parameters that support efficient power usage. Because the driver embodiments operate according to different modes (low swing output or high swing output) and according to different bias or activation voltage levels, over-voltage situations may occur. Accordingly, using logic similar to that described in relation to FIG. 5, an activation voltage is increased for first switches of the adjustable load (e.g., switches 44, 48 or 50 of first portion 18 of the adjustable load from a first activation voltage level to a second activation voltage level whenever a high supply is used (e.g., 1.5 V). Thus, the described embodiment includes references to high supply voltages and low supply voltages and to various associated bias levels.

The second step is to determine if the driver supply is high and if the KR mode of operation is enabled and, if so, the method includes the step of increasing an activation voltage from first activation voltage level to a second activation voltage level for MOSFET switches of calibrated resistors of adjustable load portion 20 of adjustable load 16 (354). More specifically, portion 20 includes calibrated resistors 24 and 26. In one embodiment, these calibrated resistors include a configuration of resistors and associated switches to switch resistors in and out of coupling to obtain precise or "calibrated" resistance values. References herein to activation voltages are voltage levels that are used to turn on a device. Activation voltages may include, for example, bias voltage levels. The MOSFET switches of these calibrated resistors also should have their activation voltage levels adjusted based upon mode of operation. The method also more generally includes determining if combination supply voltage and output mode creates an over-voltage situation across a MOSFET of the driver and, if so, increase an activation voltage level of the MOSFET (358).

Figure 14:
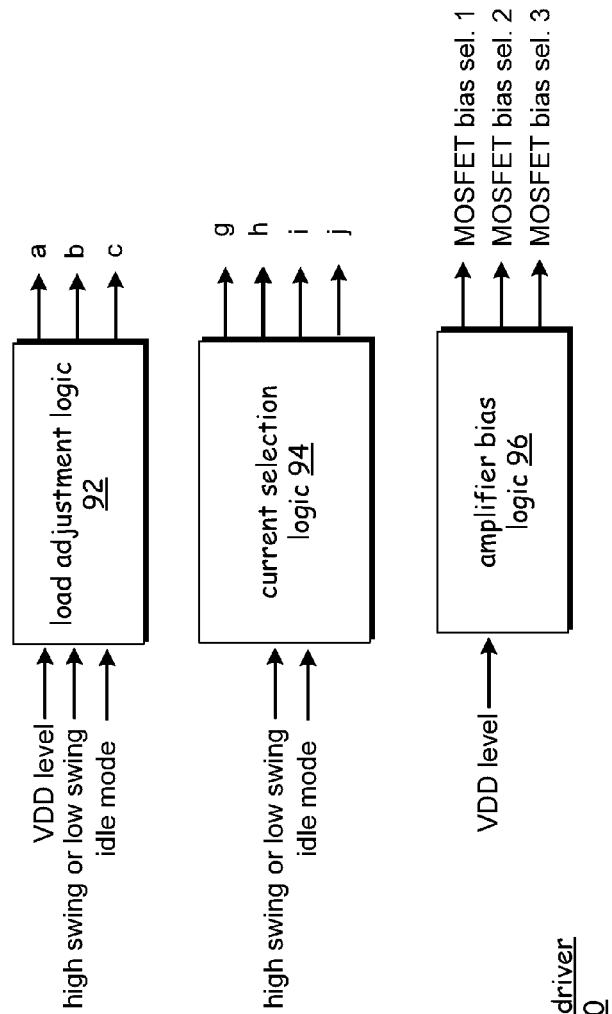
FIG. 14 is a functional block diagram of a calibrated resistor according to one embodiment of the invention.

FIG. 14 is a functional and exemplary embodiment of a calibrated resistive element. For exemplary purposes, a structure for a calibrated resistive element is shown to be used wherever calibrated resistive elements such as resistive element 24 are used. As may be seen, a base and continuously coupled resistor is coupled to a plurality of selectable signal paths that each comprise a switch (e.g., a MOSFET operable as a switch) and a resistive element. Thus, the overall resistance may be decreased in a calibrated amount by switching one or more of the parallel coupled signal paths with the resistive elements into coupling. One of average skill in the art may readily determine what the resistive values such be and the number of such selectable paths to achieve design requirements for calibration of the resistive elements. It should also be mentioned that the various MOSFET bias select signals may be used to select activation voltages for the MOSFET switches to avoid over voltage conditions as described herein.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A multi-mode driver, comprising:
   a two-stage adjustable load further including:
      a first stage that includes a plurality of selectable signal paths;
      a second stage coupled to the first stage that includes at least one resistive element; and
      wherein a total resistance of the two-stage adjustable load is based upon a selected signal path of the first stage and the at least one resistive element of the second stage;
   first and second amplifiers coupled to an output of the two-stage adjustable load wherein at least one of the first and second amplifiers is selectable; and
   load selection logic for selecting at least one of the plurality of selectable signal paths and at least one of the first and second amplifiers based upon whether a mode of operation of the multi-mode driver is one of a high swing mode, a low swing mode or an idle mode and based upon a supply voltage level.

2. The multi-mode driver of claim 1 wherein the driver is configured to:
   place the first and second selectable amplifiers in the reduced power mode during the idle mode;
   select the first amplifier for operation during the low swing mode and leave the second selectable amplifier in a reduced power mode; and
   select both the first and second amplifiers for operation during the high swing mode.

3. The multi-mode driver of claim 1 further including gate bias voltage selecting logic for selecting an activation voltage of a plurality of MOSFET switch devices based upon whether the driver is in the low swing or the high swing mode of operation.

4. The multi-mode driver of claim 1 further including gate bias voltage selecting logic for selecting an activation voltage of a plurality of MOSFET switch devices based upon the supply voltage level.

5. The multi-mode driver of claim 1 further including current scaling logic to scale an amplifier current level of the first and second selectable amplifiers based upon the mode of operation.

6. The multi-mode driver of claim 5 further including selectable current sources for the first and second amplifiers to reduce power consumption based on the mode of operation.

7. The multi-mode driver of claim 1 wherein the first and second amplifiers are differential amplifiers having differential outputs and wherein the second stage of the adjustable load comprises a pair of calibrated resistive elements, coupled to the differential outputs of the first and second amplifiers.

8. The multi-mode driver of claim 1 wherein the multi-mode driver maintains a substantially constant common mode voltage at an output of the multi-mode driver when transitioning from one of the low swing mode or the high swing mode to the idle mode.

9. The multi-mode driver of claim 1 wherein the plurality of selectable signal paths comprises:
   a first selectable signal path further including a calibrated resistor for operation in the low swing mode of operation when the supply voltage is a first supply voltage level;
   a second selectable signal path for operation:
      in the high swing mode of operation when the supply voltage is at the first supply voltage level; and
      in the low swing mode of operation when the supply voltage is at a second supply voltage level which is lower than the first supply voltage level;
   a third selectable path for operation in the idle mode of operation; and
   a gate bias selecting logic for selectively applying an activation voltage across a gate terminal to avoid over-voltage based on a mode of operation and the supply voltage level.

10. A multi-mode driver, comprising:
    a plurality of selectable signal paths in an adjustable load;
    circuitry operable to selecting one of the plurality of selectable signal paths based upon at least one of whether:
       the multi-mode driver is operating in one of a high swing mode, a low swing mode or an idle mode of operation; and
       a supply voltage level is a first voltage level or a second voltage level;
    a plurality of selectable amplifiers; and
    circuitry operable to selecting one of the plurality of selectable amplifiers based upon whether the multi-mode driver is operating in one of a high swing mode, a low swing mode or an idle mode of operation.

11. The multi-mode driver of claim 10 wherein the multi-mode driver selects a first selectable signal path of the selectable load when:
    the mode of operation is the low swing mode and the supply voltage is the first voltage level.

12. The multi-mode driver of claim 10 wherein the multi-mode driver selects a second selectable signal path when:
    the mode of operation is the high swing mode and the supply voltage is the first voltage level; and
    the mode of operation is the low swing mode and the supply voltage is the second voltage level.

13. The multi-mode driver of claim 12 wherein the second voltage level of the supply voltage is a lower magnitude voltage level than the first voltage level.

14. The multi-mode driver of claim 12 wherein the multi-mode driver selects a third selectable signal path when:
the mode of operation is the idle mode of operation.

15. A method in a multi-mode driver, comprising:
determining whether a supply is producing a first or a second voltage level;
determining if a mode of operation for a multi-mode driver is a high swing mode or a low swing mode;
selecting a first signal path of an adjustable load having a first calibrated resistive element when the determined mode of operation is the low swing mode and the supply is producing the first voltage level;
selecting a second signal path of the adjustable load when the determined mode of operation is the low swing mode and the supply is producing the second voltage level;
selecting the second signal path of the adjustable load when determined mode of operation is the high swing mode and the supply is producing the first voltage level;
selecting a first of a plurality of amplifiers for operation when the mode of operation is a low swing mode; and
selecting the first and a second of the plurality of amplifiers for operation when the mode of operation is the high swing mode.

16. The method of claim 15 further including selecting a third signal path of the adjustable load when the mode of operation is an idle mode of operation and maintaining an activation or bias level for at least one device that is the same as the activation or bias level from a preceding mode of operation.

17. The method of claim 16 further including decoupling a selectable current source for each of the plurality of amplifiers when in the idle mode of operation.

18. The method of claim 15 further including turning off the second of the plurality of amplifiers when in operating in the low swing mode.

19. The method of claim 15 further including selecting a gate bias or activation voltage of a plurality of MOSFET switch devices operably disposed within at least one of the adjustable load and the plurality of amplifiers based upon whether the multi-mode driver is operating in the high swing mode or the low swing mode.

20. The method of claim 15 further including selecting the gate bias or activation voltage of the plurality of MOSFET switch devices based upon whether the supply is producing the first or the second voltage level.

21. The method of claim 15 further including substantially maintaining a common mode voltage level after transitioning from the high swing mode to the idle mode.

22. The method of claim 15 further including substantially maintaining a common mode voltage level after transitioning from the low swing mode to the idle mode.

23. A multi-mode driver, comprising:
a plurality of amplifiers;
an adjustable load that defines a plurality of load signal paths coupled between the plurality of amplifiers and a supply;
adjustable current supply circuitry that selectively adjusts current magnitudes supplied to at least one of the plurality of amplifiers; and
wherein the multi-mode driver is operable to support operations in one of a plurality of driver modes of operation by selecting at least one of a plurality of amplifiers to adjust the supplied current magnitudes, by selecting or coupling to one of a higher magnitude or lower magnitude voltage supply level, and by selecting at least one of a plurality of load signal paths.

24. The multi-mode driver of claim 23, wherein, when operating in an idle mode of operation, the multi-mode driver maintains a common mode voltage level at an output of the multi-mode driver.

25. The multi-mode driver of claim 23 wherein, when operating in an idle mode of operation, the multi-mode driver places each of the plurality of amplifiers in a low current mode of operation.

26. The multi-mode driver of claim 23 configured to operate in a KR mode of operation wherein, when operating in a KR mode with a higher voltage supply, the multi-mode driver selects at least two of the plurality of amplifiers for operation, selects at least one selectable current source, selects a signal path to increase a supply level, and produces a high swing output.

27. The multi-mode driver of claim 23 configured to operate in an SR4 mode of operation, wherein, when operating in an SR4 with a higher voltage supply, the multi-mode driver selects a first amplifier for operation and at least one selectable current source and selectively places a second amplifier in a reduced current mode and deselects at least one current source, selects a signal path to maximize a resistive load magnitude of the adjustable load to prevent over-voltage, and produces a low swing output.

28. The multi-mode driver of claim 27 wherein, when operating in the SR4 mode, the reduced current mode for the second amplifier is no current and the multi-mode driver turns off the second amplifier.

29. The multi-mode driver of claim 23 configured to operate in an SFI mode of operation, wherein, when operating in an SFI with a lower voltage supply, selects a first amplifier for operation and at least one selectable current source and selectively places a second amplifier in a reduced current mode and deselects at least one current source, selects a signal path to increase the supply level, and produces a low swing output.

30. The multi-mode driver of claim 29 wherein, when operating in the SFI mode, the reduced current mode for the second amplifier is no current and the multi-mode driver turns off the second amplifier.

* * * * *

UNITED STATES PATENT AND TRADEMARK OFFICE
CERTIFICATE OF CORRECTION

PATENT NO. : 8,106,708 B2
APPLICATION NO. : 12/826645
DATED : January 31, 2012
INVENTOR(S) : Anand Jitendra Vasani et al.

Page 1 of 1

It is certified that error appears in the above-identified patent and that said Letters Patent is hereby corrected as shown below:

In the Claims

Col. 16, line 45, in claim 10: replace "selecting one" with --select one--
Col. 16, line 53, in claim 10: replace "selecting one" with --select one--
Col. 17, line 38, in claim 18: replace "in operating in" with --operating in--

Signed and Sealed this
Twenty-eighth Day of May, 2013

Teresa Stanek Rea
*Acting Director of the United States Patent and Trademark Office*